United States Patent [19]
Cameron et al.

[11] Patent Number: 5,122,767
[45] Date of Patent: Jun. 16, 1992

[54] SAW DEVICE TAPPED DELAY LINES

[75] Inventors: Thomas P. Cameron, Kanata, Canada; Paul A. Kennard, Pleasanton, Calif.; John C. B. Saw, Nepean; Mark S. Suthers, Lanark, both of Canada

[73] Assignee: Northern Telecom Limited, Montreal, Canada

[21] Appl. No.: 639,606

[22] Filed: Jan. 10, 1991

[51] Int. Cl.⁵ .................................................. H03H 9/00
[52] U.S. Cl. ..................................... 333/154; 333/196; 310/313 C
[58] Field of Search ................... 333/196, 154, 195, 28, 333/18; 310/313 C, 313 R, 313 B, 313 D

[56] References Cited

U.S. PATENT DOCUMENTS

| | | | |
|---|---|---|---|
| 3,968,461 | 7/1976 | Mitchell | 310/313 C |
| 4,405,874 | 9/1983 | Suthers | 333/154 |
| 4,602,183 | 7/1986 | Okamoto | 333/154 |
| 4,604,595 | 8/1986 | Kadota | 310/313 C |
| 4,635,009 | 1/1987 | Ebata | 333/196 |
| 4,814,658 | 3/1989 | Suthers | 333/154 |
| 5,051,709 | 9/1991 | Birkett | 333/154 |

OTHER PUBLICATIONS

M. Suthers et al., "SAW Nyquist Filters for Digital Radio", Proceedings of the IEEE 1987 Ultrasonics Symposium.
M. Suthers et al., "SAW Bandpass Filter Design Using Hermitian Function Techniques", IEEE Transactions on Sonics and Ultrasonics, vol. SU-27, No. 2, Mar. 1980.

Primary Examiner—Eugene R. LaRoche
Assistant Examiner—A. Zarabian
Attorney, Agent, or Firm—R. John Haley

[57] ABSTRACT

A SAW (surface acoustic wave) device tapped delay line comprises a continuous pattern of bifurcated inter-digital fingers having a constant pitch of $\lambda/2$ and forming a first IDT (inter-digital transducer), a plurality of second IDTs, substantially identical to one another and arranged with a predetermined pitch P for consecutively receiving a SAW propagated from the first IDT with respective propagation delays, and grounded dummy fingers in regions between adjacent IDTs. The first IDT is apodized in accordance with a Hermitian response to provide it with a pass band centered at a first frequency, and $\lambda$ is the wavelength of a SAW at a second frequency different from the first frequency and within the pass band. P is an integral multiple of $\lambda/2$, so that there is a constant finger periodicity throughout the SAW device whereby reflections between the second IDTs are avoided. The SAW device tapped delay line is used in an adaptive time delay equalizer of a high capacity microwave radio communications system, with the first frequency equal to the receiver intermediate frequency and the second frequency being an integral multiple of half the symbol rate of the system.

14 Claims, 5 Drawing Sheets

SAW DEVICE TAPPED DELAY LINES

This invention relates to SAW (surface acoustic wave) device tapped delay lines and to apparatus using such delay lines. Such apparatus may, for example, comprise an adaptive time delay equalizer of a receiver of a microwave radio digital signal communications system.

REFERENCE TO RELATED APPLICATION

Reference is directed to U.S. patent application Ser. No. 382,921 filed Jul. 20, 1989, now U.S. Pat. No. 5,051,709 issued Sept. 24, 1991 in the names of A. N. Birkett et al. and entitled "SAW Device Tapped Delay Line And Equalizes", the entire disclosure of which is hereby incorporated herein by reference.

BACKGROUND OF THE INVENTION

It is well known to use SAW devices for filtering purposes in microwave radio communications systems. With increasing capacities of such systems, very stringent demands have been placed on the design and fabrication of such SAW devices, so that they have been developed to an advanced stage. For example, Suthers et al. U.S. Pat. No. 4,814,658 issued Mar. 21, 1989 and entitled "SAW Device with Continuous Finger Pattern" describes and claims an advanced form of SAW device which is particularly useful for filtering purposes in microwave radio systems, and discusses earlier developments embodied in such a SAW device.

In addition to filters, microwave radio systems include other circuits, such as equalizers, which can benefit by the incorporation therein of appropriate SAW devices. In particular, a microwave radio receiver invariably includes an ATDE (adaptive time domain equalizer), which may incorporate a transversal filter comprising a tapped delay line. The U.S. patent application Ser. No. 382,921 referred to above describes and claims a SAW device tapped delay line which is particularly suitable for use at the IF (intermediate frequency) of a high capacity microwave radio communications system.

A problem arises with such SAW device tapped delay lines in that the transmitted symbol rate of the system and the IF are independently determined. In particular, the IF is not an integral multiple of half the symbol rate. The symbol rate determines the pitch, or center-to-center spacing, of the IDTs (inter-digital transducers) which form the taps of the tapped delay line, whereas the pitch of the inter-digital fingers themselves is determined by the IF. Consequently, the IDT pitch is not an integral multiple of the finger pitch, so that there is necessarily a discontinuity in the finger pitch between adjacent IDTs. Such discontinuities give rise to reflections of a propagated SAW among the IDTs, with consequent deterioration in performance, and this is exacerbated by the large number (for example, 17) of IDT taps which may be necessary to achieve the required level of performance in a high capacity communications system.

In the SAW device tapped delay line of the above application, various arrangements of grounded dummy fingers are provided between adjacent IDT taps, but in each instance there is a discontinuity in periodicity due to the above consideration. In addition to the above application, there are various arrangements of SAW device tapped delay line described in the prior art. However, again in each of these known arrangements there is a discontinuity in finger periodicity from each IDT tap to the next, usually no fingers at all being present in regions between the IDTs. As described above, these discontinuities give rise to impaired performance, which is sufficient largely to prevent SAW device tapped delay lines from being implemented in practical communications systems, in spite of the considerable advantages which they could otherwise provide.

An object of this invention, therefore, is to provide an improved SAW device tapped delay line in which the problem described above is substantially eliminated.

SUMMARY OF THE INVENTION

According to one aspect of this invention there is provided a SAW (surface acoustic wave) device tapped delay line comprising: a first, apodized, IDT (inter-digital transducer) having a pass band centered at a first frequency; and a plurality of second IDTs, substantially identical to one another, arranged with a predetermined pitch P for consecutively receiving a SAW propagated from the first IDT with respective propagation delays; wherein each of the first and second IDTs comprises inter-digital fingers with a constant pitch, in the direction of SAW propagation, of $\lambda/2$ and P is an integral multiple of $\lambda/2$, where $\lambda$ is the wavelength of a SAW at a second frequency within the pass band and different from the first frequency, and wherein the inter-digital fingers of the first IDT are bifurcated and weighted in accordance with a Hermitian response (symmetric amplitude and antisymmetric phase response) imaged about twice the second frequency.

The SAW device preferably includes grounded dummy fingers in any regions between adjacent IDTs, all of the fingers of the IDTs and the dummy fingers being bifurcated and having said constant pitch whereby there is a constant finger periodicity throughout the SAW device. The second frequency is preferably an integral multiple of half the bandwidth of the pass band of the first IDT.

According to another aspect this invention provides a SAW (surface acoustic wave) device tapped delay line comprising: a first IDT (inter-digital transducer) comprising inter-digital fingers with a pitch of $\lambda/2$, said fingers being bifurcated and weighted to provide the first IDT with an apodization pattern in accordance with a Hermitian response, the apodization pattern providing the first IDT with a pass band centered at a first frequency, where $\lambda$ is the wavelength of a SAW at a second frequency different from the first frequency and within the pass band; a plurality of second IDTs, substantially identical to one another and each comprising inter-digital fingers with said pitch of $\lambda/2$, arranged with a predetermined pitch P for consecutively receiving a SAW propagated from the first IDT with respective propagation delays, where P is an integral multiple of $\lambda/2$; and in any regions between adjacent ones of the second IDTs, grounded dummy fingers with said pitch of $\lambda/2$ to provide a constant finger periodicity throughout the second IDTs.

According to a further aspect of the invention there is provided a SAW (surface acoustic wave) device tapped delay line comprising a continuous pattern of bifurcated inter-digital fingers having a constant pitch of $\lambda/2$ and forming a first IDT (inter-digital transducer), a plurality of second IDTs, substantially identical to one another and arranged with a predetermined pitch P for consecutively receiving a SAW propagated from the first IDT with respective propagation delays, where P is an integral multiple of $\lambda/2$, and grounded dummy fingers in any regions between adjacent IDTs, wherein the first IDT is apodized in accordance with a Hermitian response to provide the first IDT with a pass band centered at a first frequency, and wherein $\lambda$ is the wavelength of a SAW at a second frequency different from the first frequency and within the pass band.

The invention further extends to a SAW device tapped delay line as recited above in an ATDE (adaptive time delay equalizer) for operation at an IF (intermediate frequency) of a microwave radio communications system using QAM (quadrature-phase amplitude modulation) and communicating symbols at a predetermined symbol rate, wherein the first frequency is equal to the IF and the second frequency is an integral multiple of half the symbol rate.

Thus the invention facilitates the provision of a SAW device tapped delay line, especially suitable for use in an ATDE of a high capacity microwave radio communications system, in which the pass band is centered on a first frequency (the IF) and the finger periodicity is dependent upon a second frequency, independent of the first frequency and within the pass band, which second frequency is made an integral multiple of half the symbol rate so that the finger periodicity can be constant throughout all of the SAW device.

BRIEF DESCRIPTION OF THE DRAWINGS

The invention will be further understood from the following description with reference to the accompanying drawings, in which similar references are used in different figures to denote similar components and in which.

DETAILED DESCRIPTION

Figure 1:
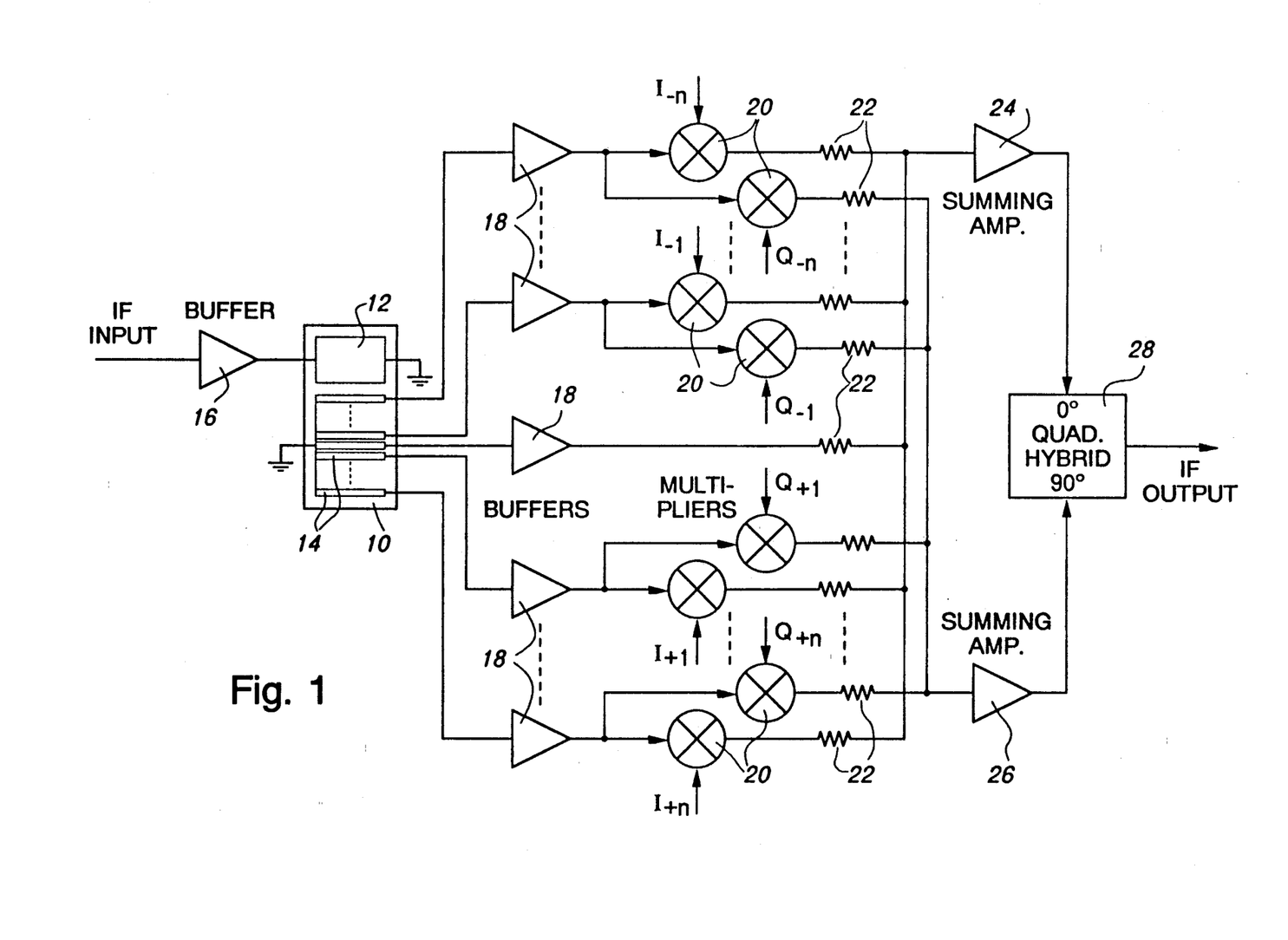
FIG. 1 is a block diagram illustrating an IF ATDE (intermediate frequency adaptive time delay equalizer), using a SAW (surface acoustic wave) device tapped delay line, for a microwave radio receiver.

Referring to FIG. 1, there is illustrated an ATDE for a QAM (quadrature-phase amplitude modulated) microwave radio receiver for equalizing I and Q carrier signal components, which are in phase quadrature, at an IF (intermediate frequency) of the receiver. Such an arrangement is described and claimed in U.S. patent application Ser. No. 382,921 already referred to.

The ATDE of FIG. 1 comprises a transversal filter including a SAW device 10 which provides a tapped delay line. The SAW device 10 includes an apodized IDT (abbreviated below to AIDT) 12 and a number $2n+1$, where n is an integer, of unapodized IDTs (abbreviated below to UIDTs) 14 which serve as input and output IDTs respectively. An input IF signal is coupled to the input AIDT via a buffer 16 having a low output impedance, and optionally also via series tuning components which are not shown. The $2n+1$ outputs from the UIDTs 14, each buffered by a respective buffer 18 having a low input impedance, are multiplied in multipliers 20 by respective I component equalization coefficients $I_{-n}$ to $I_{+n}$ and Q component equalization coefficients $Q_{-n}$ to $Q_{+n}$ to produce currents through resistors 22. These currents are summed in summing amplifiers 24 and 26 for the I and Q components respectively, and the outputs of the summing amplifiers are combined in a quadrature hybrid 28 to produce an equalized IF output signal. The equalization coefficients are produced and automatically updated in known manner by control circuitry which is not shown.

Such an ATDE may be used for example in a 512-QAM digital microwave radio communications system in which each transmitted symbol represents 9 bits ($2^9=512$), the transmitted symbol rate is 35.84 MHz (to be accommodated within a 40 MHz channel), and the IF is 140 MHz. The SAW device 10 can have 17 UIDTs 14, all substantially identical to one another, spaced apart from one another with a pitch (in the direction of propagation of a SAW from the input IDT 12) which corresponds to the symbol rate. It should be appreciated that in such a system the IF and symbol rate are independently determined, and there is not an integral multiple relationship between them.

Figure 2:
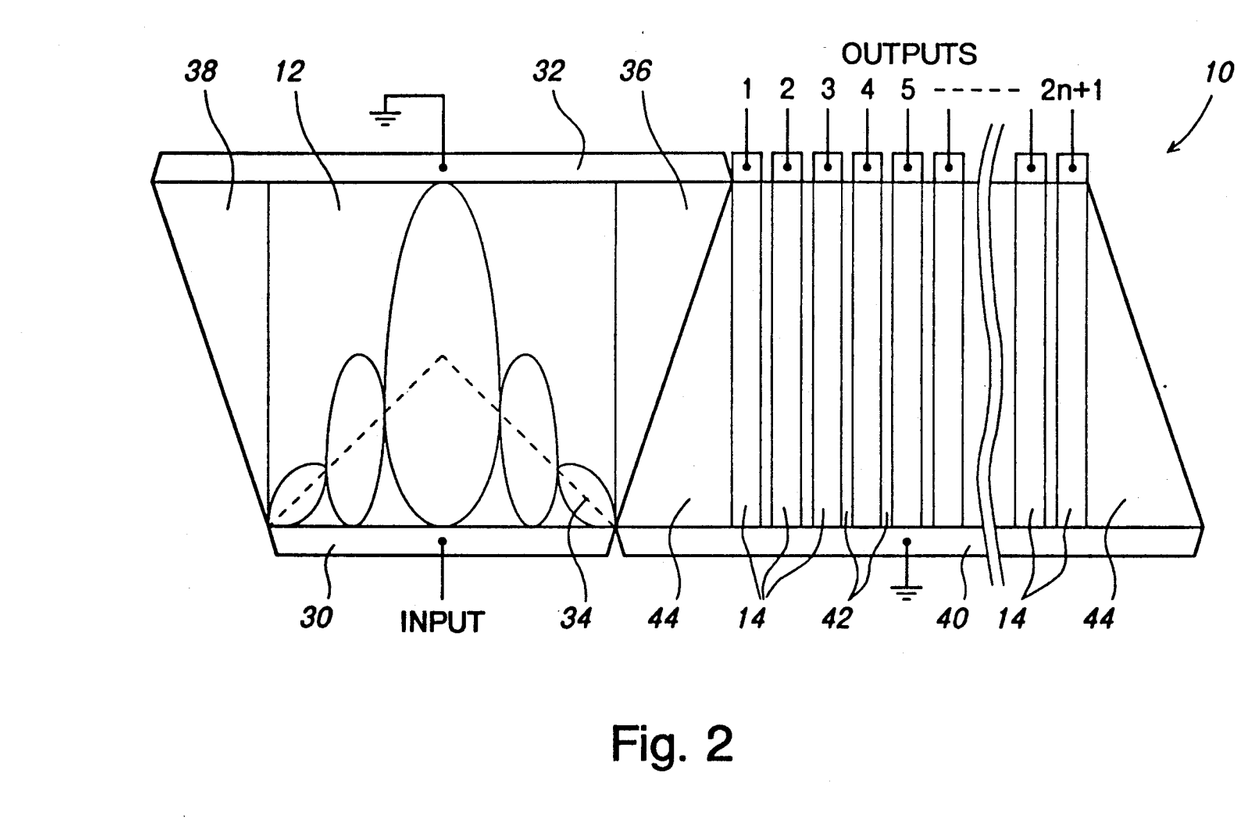
FIG. 2 illustrates the SAW device of FIG. 1 in greater detail.

FIG. 2 illustrates in greater detail the form of the IDTs 12 and 14 of the SAW device 10. The input AIDT 12 has a driven conductive rail 30 to which the input signal from the buffer 18 is applied, a grounded conductive rail 32, an apodization pattern having an axis, shown by a broken line 34, which has the shape of a V extending from the ends of the driven rail 30, and grounded front and rear tapered reflection suppressing dummy finger regions 36 and 38 respectively, all of the form known from Suthers et al. U.S. Pat. No. 4,814,658 already referred to. As already mentioned, the $2n+1$ UIDTs 14 are all substantially identical to one another; they have a common grounded conductive rail 40, which is distinct from the grounded rail 32 to provide isolation between the input and output circuits of the SAW device, and respective output connections numbered 1 to $2n+1$. The spacing of the IDTs 14 is such that a SAW propagated from the IDT 12 reaches successive output IDTs 14 after successive delays T, the delay period T being the reciprocal of the symbol rate. Grounded dummy fingers are provided in regions 42 between adjacent IDTs 14, and grounded tapered reflection suppressing regions 44 are provided adjacent the end IDTs 14 numbered 1 and $2n+1$, the former region complementing the taper of the fingers 36 in the manner described in the Suthers et al. patent referred to above. As a result of the presence of the grounded fingers in the regions 36, 42, and 44, there is a continuous sequence of fingers throughout the SAW device 10 from the IDT 12 through all of the IDTs 14.

Figure 3:
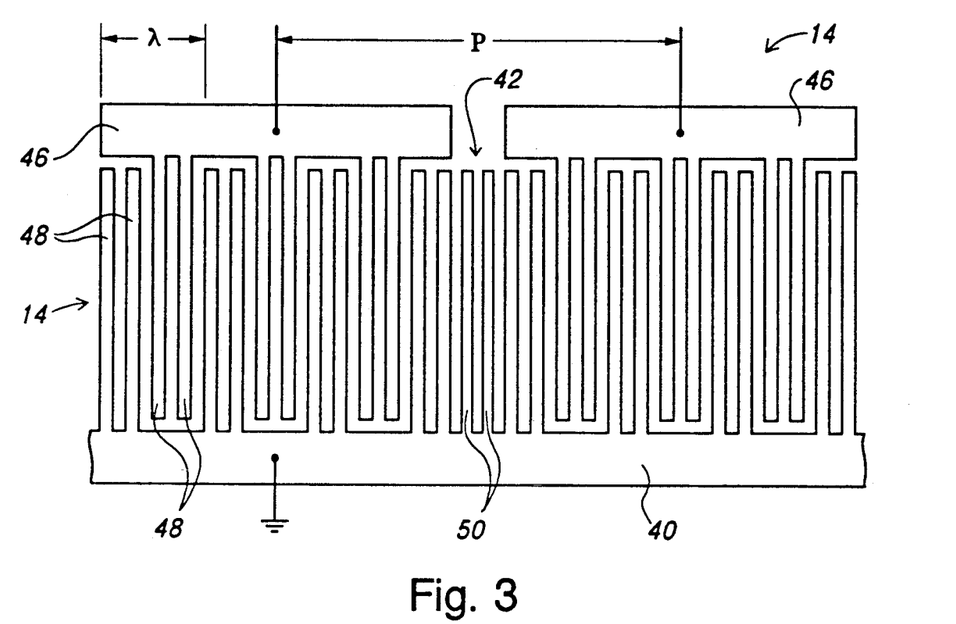
FIG. 3 illustrates in greater detail a previous arrangement of adjacent output IDTs (inter-digital transducers) of the SAW device of FIG. 2.

FIG. 3 illustrates in greater detail the arrangement of two adjacent output IDTs 14, the output rails being referenced 46. In FIG. 3, each UIDT 14 is shown as extending over a distance of 3.5 wavelengths $\lambda$ at the IF, for which the SAW device 10 is designed, the fingers of each UIDT 14 having a pitch of $\lambda/2$. In order to reduce reflections, as is well known the fingers are bifurcated to form pairs of inter-digital fingers 48 extending alternately from the grounded and output rails. Within each UIDT 14, each fingers 48, and each gap between two adjacent fingers 48, has a width of $\lambda/8$, the IDTs thereby having a metallization ratio of 0.5. Thus as shown in FIG. 3 each UIDT 14 comprises 3 pairs of fingers 48 extending from the respective output rail 46 and 4 pairs of fingers extending from the grounded rail 40. The arrangement of the fingers of the AIDT 12 and of the grounded dummy fingers in the regions 36, 38, and 44 is similar, these fingers also being bifurcated with a finger pitch of $\lambda/2$ (for each bifurcated finger pair) and also having a metallization ratio of 0.5.

FIG. 3 also shows two grounded dummy fingers 50 in a region 42 between the two output IDTs 14. Because the symbol rate and the IF are independent and unrelated as already discussed above, the pitch or center-to-center spacing P of the UIDTs 14 is not an integral multiple of $\lambda/2$, so that the grounded dummy fingers 50 in each region 42 between the IDTs 14 have a different width to that of the fingers 48 within the IDTs 14. The widths of the fingers 50 and the gaps therebetween are selected also to provide a metallization ratio of 0.5 to maintain a substantially constant SAW velocity. As can be seen in FIG. 3, in this case the fingers 50 and the associated gaps have slightly narrower widths than the fingers 48 and the gaps between them.

More particularly, using the IF and symbol rate figures mentioned above, and representing distances in the SAW propagation direction by the times which it takes the SAW to propagate through such distances, the wavelength $\lambda$ is 1/140 MHz or 7.142857 ns. The pitch P of the UIDTs 14 is 1/35.84 MHz or 27.901785 ns, and the ratio of these is 3.90625. In other words, the pitch P corresponds to 3.90625 wavelengths $\lambda$, of which 3.5 wavelengths are constituted by the finger pairs 48 of the output UIDTs 14 and the remaining 0.40625 wavelengths are taken up by the reduced-width dummy grounded fingers 50 and associated gaps.

The reduced width of the fingers 50 in the regions 42 between the output IDTs 14 constitutes a discontinuity in the periodicity of fingers throughout the SAW device 10. This discontinuity is undesirable because it contributes to SAW reflections between the output IDTs, thereby detracting from the uniformity of the responses of the different output IDTs. The discontinuity can be avoided by constraining either the symbol rate of the system of the IF so that the IF is an integral multiple of half the symbol rate. However, this is also undesirable because it imposes a constraint upon either the symbol rate or the IF of the system. The present invention enables the IF and the symbol rate to be independent of one another, but avoids any discontinuity in the periodicity of fingers of the SAW device.

Figure 4:
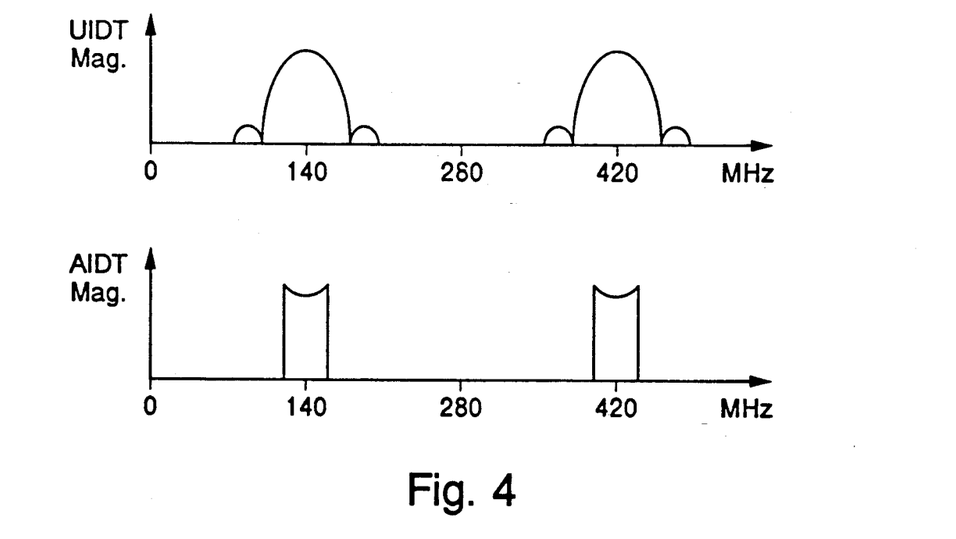
FIG. 4 illustrates frequency domain responses of the unapodized and apodized IDTs of the SAW device of FIGS. 2 and 3.

Before describing the invention further, reference is made to FIG. 4 to provide an understanding of known design procedures for a SAW device such as the device 10. FIG. 4 illustrates, at the top and bottom respectively, the frequency domain response magnitudes of a UIDT 14 and of an AIDT 12 of a SAW device 10 designed as described above to operate at a frequency of 140 MHz (the IF). This designed frequency is referred to below as the designed operating frequency of the SAW device 10, but it should be appreciated that the SAW device 10 actually has a bandpass filter characteristic with a pass band which, in the prior art, is centered on this designed operating frequency.

As illustrated at the top of FIG. 4, the frequency domain response of an unapodized IDT such as the UIDTs 14 consists of a (sin x)/x function which is centered on the designed operating frequency of 140 MHz, the total response from 0 to twice this frequency, i.e. 280 MHz, being mirror imaged about the latter frequency so that a (sin x)/x function is also produced at the third harmonic of the operating frequency, i.e. centered on a frequency of 420 MHz. The frequency domain response of the apodized IDT, which is determined by the apodization pattern of the AIDT, is designed to compensate for the (sin x)/x function, and also to give a desired overall frequency response for the IF signal in the microwave radio receiver. In this respect, the apodization pattern of the AIDT 12 also serves as an IF spectral shaping filter. The frequency domain response of the AIDT 12 is thus designed to have a form such as that shown at the bottom of FIG. 4. This frequency response consists of pass bands centered at the operating frequency of 140 MHz and its third harmonic at 420 MHz, each extending, as is well known, by half the symbol rate of 35.84 MHz, i.e. by 17.92 MHz, above and below the center frequency. As is illustrated in FIG. 4, the attenuation of the AIDT in each pass band is complementary to the (sin x)/x function over the same frequency range.

The desired frequency domain response of the AIDT 12 as shown at the bottom of FIG. 4 is used as an input to a Fast Fourier Transform (FFT) in order to synthesize the apodization pattern of the AIDT, i.e. to determine the finger lengths of the IDT throughout the apodization pattern. However, using the frequency domain response directly would generally result in complex values for the length of each bifurcated finger pair. (Each complex value can be considered to comprise a real value representing a finger length, which length is the same for the two fingers of a bifurcated finger pair, plus an imaginary value representing a phase shift or finger displacement in the direction of propagation of the SAW. However, such finger displacement is undesirable and impractical to achieve with current photolithography techniques.)

In order to avoid this problem, the desired frequency domain response of the AIDT 12 is used to generate a Hermitian set of specifications, or Hermitian response, which when applied to the FFT to synthesize the AIDT apodization pattern results in real rather than complex values for the finger lengths or tap weights. In other words, the Hermitian response is such that the imaginary part of each result from the FFT is zero. A result of this process is that the individual fingers of each bifurcated finger pair, which would otherwise be of equal length, are now provided with individually determined and distinct lengths. (The use of the Hermitian response can be considered as transforming the finger displacement of two equal-length bifurcated fingers, as mentioned above, into unequal lengths of these fingers, without any finger displacement, to provide the same result.)

The use of a Hermitian response in this manner, together with the iterative use of a FFT to synthesize an AIDT, is known in the art. It is described, for example, in an article entitled "SAW Nyquist Filters For Digital Radio" by M. S. Suthers et al., IEEE 1987 Ultrasonics Symposium Proceedings, 1987, particularly in Sections 6.0 and 7.0 thereof. It is also described in greater detail in an article entitled "SAW Bandpass Filter Design Using Hermitian Function Techniques" by M. S. Suthers et al., IEEE Transactions on Sonics and Ultrasonics, Vol. SU-27, No. 2, March 1980.

Figure 5:
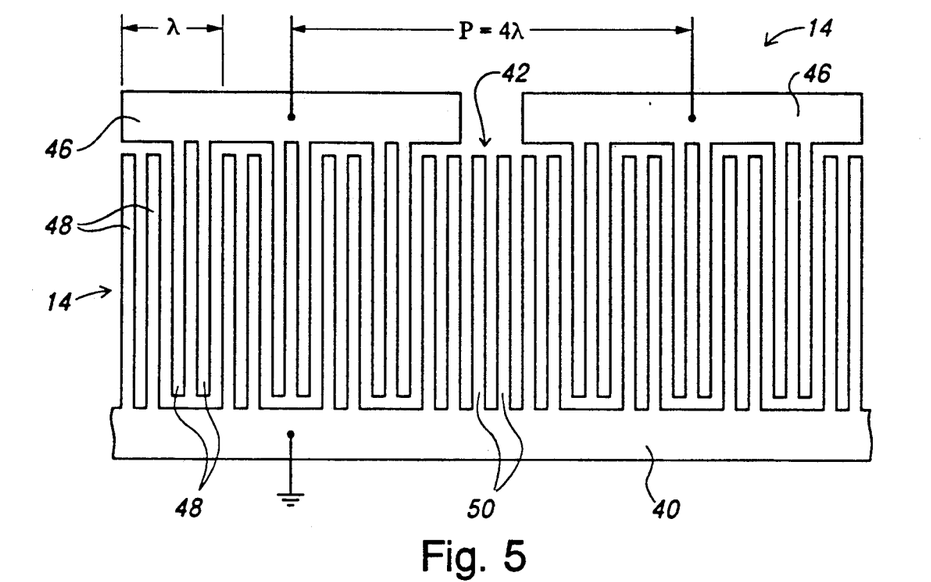
FIG. 5 illustrates in greater detail an arrangement of adjacent output IDTs of the SAW device of FIG. 2 in accordance with this invention.

Referring now to FIG. 5, in accordance with this invention the SAW device 10 is designed to have an operating frequency wavelength λ which is determined in dependence upon the pitch or center-to-center spacing P of the consecutive output IDTs 14, so that the pitch P is an integral multiple of half the wavelength λ. In other words, $P = k\lambda/2$, where k is an integer. It is important to appreciate that this wavelength λ is constant and determined for the entire SAW device 10, including the AIDT 12 and the grounded fingers in the regions 36, 38, and 44, as well as the UIDTs 14 and the grounded fingers in the regions 42. Thus there is a constant periodicity of fingers (i.e. the finger pitch of λ/2 is constant), as well as a constant metallization ratio, throughout the entire SAW device 10, whereby SAW reflections between different parts of the device 10 are substantially eliminated.

It should also be appreciated that in accordance with the invention the width of each UIDT 14 may be the same as the pitch P, so that the IDTs 14 are contiguous with one another and the regions 42 of grounded fingers 50 are dispensed with.

Using the same figures as given above, in the SAW device 10 whose UIDTs 14 are as illustrated in FIG. 5 the pitch P is 1/35.84 MHz or 27.901785 ns as before. The designed operating frequency wavelength λ is determined in accordance with the equation $P = k\lambda/2$ so that the designed operating frequency is as close as possible to the IF of 140 MHz. This gives the result that $k = 8$ and $P = 4\lambda$ as illustrated in FIG. 5. The SAW device 10 is designed for an operating frequency wavelength of the symbol rate multiplied by k/2, i.e. 35.84 MHz multiplied by 4, or 143.36 MHz in this case.

As is well known, the bandwidth of each output IDT 14 is determined by the total length N, in wavelengths λ at the operating frequency $f_o$, of the IDT, in accordance with the equation $f_{null} = (1 \pm 1/N) f_o$, where $f_{null}$ gives the null frequencies on each side of the operating frequency. In view of the 40 MHz bandwidth already referred to, N is selected in this case to be equal to 3.5 (it must be an integral number of half-wavelengths) so that for each IDT 14 in FIG. 5, as in FIG. 3, there are three pairs of fingers 48 extending from each output rail 46, four associated pairs of fingers 48 extending from the grounded rail 40, and one pair of dummy grounded fingers 50 in each region 42 between adjacent output IDTs 14.

Figure 6:
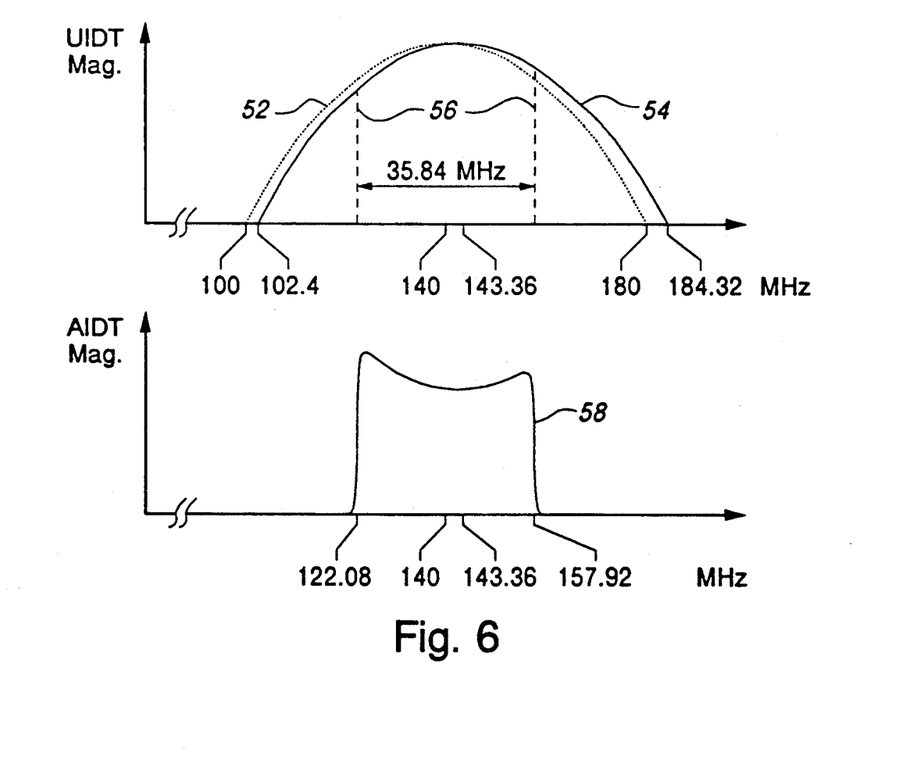
FIGS. 6 and 7 illustrate frequency domain responses of the IDTs of the SAW device of FIGS. 2 and 5 in accordance with this invention.

Referring to FIG. 6, this illustrates, in a similar manner to FIG. 4 but on an expanded frequency scale in the region of the operating frequency, frequency domain responses for each UIDT 14 and for the AIDT 12. Initially referring only to the upper part of FIG. 6 showing the UIDT response, a dotted line curve 52 illustrates the response for each UIDT 14 in FIG. 4. As already described, this has a (sin x)/x shape centered on the operating frequency which is the IF of 140 MHz, and in accordance with the above equation has null frequencies at 100 and 180 MHz. In contrast, as shown by a solid line curve 54 in the upper part of FIG. 6, each UIDT 14 in FIG. 5 has its (sin x)/x shape centered on the operating frequency of 143.36 MHz determined as described above, so that as illustrated it has null frequencies at 102.4 and 184.32 MHz. As can be seen from the different heights at which dashed lines 56, representing the Nyquist frequencies (122.08 and 157.92 MHz) at half the symbol rate above and below the 140 MHz IF which the SAW device is intended to pass, the UIDT response represented by the solid line curve 54 is asymmetric with respect to the IF.

The lower part of FIG. 6 illustrates by a curve 58 the complementary frequency domain response which the AIDT 12 is required to have in accordance with the invention. As can be clearly seen from FIG. 6, this has a pass band centered at the IF of 140 MHz and extending by half the symbol rate to the Nyquist frequencies above and below the IF, and within the pass band has an asymmetric attenuation which is complementary to the solid line curve 54 in the same frequency range.

Figure 7:
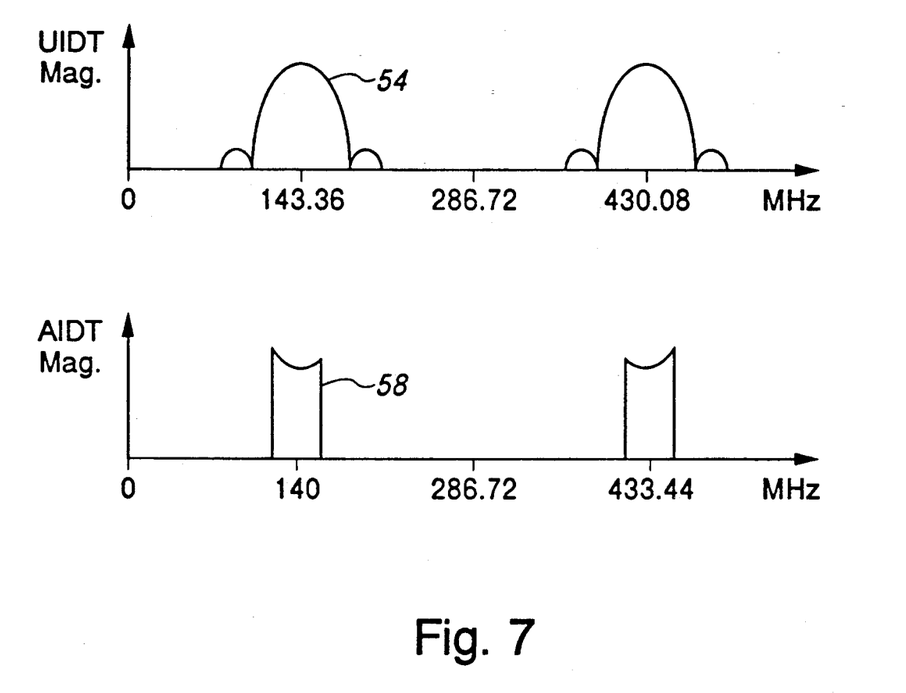

FIG. 7 illustrates, in a manner similar to that of FIG. 4, the frequency domain responses of each UIDT 14 and the AIDT 12 designed in accordance with the invention as described above with reference to FIGS. 5 and 6, over the frequency range from 0 to 573.44 MHz (four times the designed operating frequency of 143.36 MHz). As illustrated in the upper part of FIG. 7, the UIDT response comprises a (sin x)/x function centered at the designed operating frequency of 143.36 MHz, the main central lobe of which corresponds to the solid line curve 54 in FIG. 6. This is mirror-imaged about twice the operating frequency, or 286.72 MHz, to produce a corresponding response centered at the third harmonic of 430.08 MHz.

The lower part of FIG. 7 shows the AIDT response curve 58 centered on the IF of 140 MHz, and hence offset from the center of the curve 54 so that it has the asymmetry as described above with reference to FIG. 6. The imaged response is mirrored about twice the operating frequency, or 286.72 MHz, and hence is centered at a frequency of $286.72 \times 2 - 140 = 433.44$ MHz, so that it is also offset in frequency from the third harmonic response of the UIDT at 430.08 MHz, and is asymmetric as shown in FIG. 7.

In order to provide the AIDT 12 with the response represented in the lower part of FIG. 7, the same design techniques are used as have already been described above. In other words Hermitian specifications are created, in the known manner already referred to, to correspond to the response represented in the lower part of FIG. 7 and to result in real values when applied to an FFT to synthesize the AIDT apodization pattern. The FFT in this case has a maximum frequency of 573.44 MHz (i.e. 4 times 143.36 MHz, rather than 4 times 140 MHz as in the case of FIGS. 3 and 4). The resulting real values determine the finger lengths or tap weights for the individual fingers of the bifurcated finger pairs of the AIDT 12.

The result of the above process in accordance with the invention is that the SAW device 10 has a constant metallization ratio and a constant periodicity of fingers throughout its entire length, so that reflections and consequent impaired performance are avoided. At the same time, the SAW device is designed so that its outputs at the IDTs 14 are successively delayed by the inverse of the symbol rate, as is desired for example for an ATDE, while the pass band of the SAW device is centered on a frequency which is independent of, and not integrally related to, the symbol rate, this frequency being IF as described above. Accordingly, the SAW device eliminates any need for a predetermined relationship between the IF and the symbol rate.

Although particular frequencies and time delays have been referred to above, it should be appreciated that the invention is not in any way limited by these, but that they are given by way of example to provide a full understanding of the invention. The same applies to the particular numbers of fingers used in each output IDT, the number of output IDTs, and other parameters.

Thus considered more generally, for a SAW device tapped delay line to operate in an ATDE in a system with a given symbol rate and a given IF which are independent of one another, a pass band centered on the IF and with a bandwidth equal to the symbol rate (to provide a Nyquist filter) will initially be determined. Generally there will be two frequencies within this pass band which are integral multiples of half the symbol rate, and for ease of design the closest of these to the IF will be selected as the designed operating frequency of the SAW device. The wavelength λ, and hence the finger pitch λ/2, of the SAW device is thereby determined, and the remaining design follows the procedures described above.

It should also be observed that, although for convenience the output IDTs 14 have been described as being unapodized, and this would most conveniently be the case especially in view of the relatively small number of fingers in each IDT 14, this need not in fact be the case and an apodization pattern could be applied to the IDTs 14 (with all of these still being substantially identical to provide output signals which differ from one another only in their relative delays). Furthermore, although the apodized IDT 12 has been referred to as an input IDT and the IDTs 14 have been referred to as output IDTs, and this would most conveniently be the case, the functions of these could be interchanged while still providing the advantages of the present invention.

In addition, it should be appreciated that the SAW device 10 may take different forms from that specifically described above. For example, in order to enable each of the IDTs 14 to extend over a greater number of wavelengths λ, to increase the number of grounded fingers 50 in each of the regions 42 between these IDTs 14, and/or to decrease insertion loss, the IDTs 14 may be distributed on both sides (front and rear) of the apodized IDT 12 instead of only on one side as illustrated in FIG. 2, thereby utilizing the SAW's propagated in opposite directions from the IDT 12. Thus on one side of the IDT 12 the IDTs 14 with odd-numbered outputs 1, 3, . . . 2n + 1 may be provided, with a pitch or center-to-center spacing of adjacent IDTs equal to twice the inverse of the symbol rate, and on the other side of the IDT 12 the IDTs 14 with even-numbered outputs 2, 4, . . . 2n may be provided, also with a pitch or center-to-center spacing of adjacent IDTs equal to twice the inverse of the symbol rate.

Numerous other modifications, variations, and adaptations may be made to the described embodiment of the invention without departing from the scope of the invention as defined in the claims.

What is claimed is:

1. A SAW (surface acoustic wave) device tapped delay line comprising:
    a first, apodized, IDT (inter-digital transducer) having a pass band centered at a first frequency; and
    a plurality of second IDTs, substantially identical to one another, arranged with a predetermined pitch P for consecutively receiving a SAW propagated from the first IDT with respective propagation delays;
    wherein each of the first and second IDTs comprises inter-digital fingers with a constant pitch, in the direction of SAW propagation, of λ/2 and P is an integral multiple of λ/2, where λ is the wavelength of a SAW at a second frequency within the pass band and different from the first frequency, and wherein the inter-digital fingers of the first IDT are bifurcated and weighted in accordance with a Hermitian response imaged about twice the second frequency.

2. A SAW device tapped delay line as claimed in claim 1 wherein the second frequency is an integral multiple of half the bandwidth of the pass band of the first IDT.

3. A SAW device tapped delay line as claimed in claim 1 wherein the fingers of the second IDTs are bifurcated.

4. A SAW device tapped delay line as claimed in claim 1 and including grounded dummy fingers in any regions between adjacent IDTs, all of the fingers of the IDTs and the dummy fingers being bifurcated and having said constant pitch whereby there is a constant finger periodicity throughout the SAW device.

5. A SAW device tapped delay line as claimed in claim 4 wherein the second frequency is an integral multiple of half the bandwidth of the pass band of the first IDT.

6. In an ATDE (adaptive time delay equalizer) for operation at an IF (intermediate frequency) of a microwave radio communications system using QAM (quadrature-phase amplitude modulation) and communicating symbols at a predetermined symbol rate, a SAW device tapped delay line as claimed in claim 5, wherein the first frequency is equal to the IF and the second frequency is an integral multiple of half the symbol rate.

7. A SAW (surface acoustic wave) device tapped delay line comprising:
    a first IDT (inter-digital transducer) comprising inter-digital fingers with a pitch of λ/2, said fingers being bifurcated and weighted to provide the first IDT with an apodization pattern in accordance with a Hermitian response, the apodization pattern providing the first IDT with a pass band centered at a first frequency, where λ is the wavelength of a SAW at a second frequency different from the first frequency and within the pass band;
    a plurality of second IDTs, substantially identical to one another and each comprising inter-digital fingers with said pitch of λ/2, arranged with a predetermined pitch P for consecutively receiving a SAW propagated from the first IDT with respective propagation delays, where P is an integral multiple of λ/2; and
    in any regions between adjacent ones of the second IDTs, grounded dummy fingers with said pitch of λ/2 to provide a constant finger periodicity throughout the second IDTs.

8. A SAW device tapped delay line as claimed in claim 7 wherein the fingers of the second IDTs and grounded dummy fingers in any regions between adjacent ones of the second IDTs are bifurcated.

9. A SAW device tapped delay line as claimed in claim 8 wherein the second frequency is an integral multiple of half the bandwidth of the pass band of the first IDT.

10. In an ATDE (adaptive time delay equalizer) for operation at an IF (intermediate frequency) of a microwave radio communications system using QAM (quadrature-phase amplitude modulation) and communicating symbols at a predetermined symbol rate, a SAW device tapped delay line as claimed in claim 8, wherein the first frequency is equal to the IF and the second frequency is an integral multiple of half the symbol rate.

11. A SAW (surface acoustic wave) device tapped delay line comprising a continuous pattern of bifurcated inter-digital fingers having a constant pitch of $\lambda/2$ and forming a first IDT (inter-digital transducer), a plurality of second IDTs, substantially identical to one another and arranged with a predetermined pitch P for consecutively receiving a SAW propagated from the first IDT with respective propagation delays, where P is an integral multiple of $\lambda/2$, and grounded dummy fingers in any regions between adjacent IDTs, wherein the first IDT is apodized in accordance with a Hermitian response to provide the first IDT with a pass band centered at a first frequency, and wherein $\lambda$ is the wavelength of a SAW at a second frequency different from the first frequency and within the pass band.

12. In an ATDE (adaptive time delay equalizer) for operation at an IF (intermediate frequency) of a microwave radio communications system using QAM (quadrature-phase amplitude modulation) and communicating symbols at a predetermined symbol rate, a SAW device tapped delay line as claimed in claim 11, wherein the first frequency is equal to the IF and the second frequency is an integral multiple of half the symbol rate.

13. A SAW device tapped delay line as claimed in claim 11 wherein the second frequency is an integral multiple of half the bandwidth of the pass band of the first IDT.

14. In an ATDE (adaptive time delay equalizer) for operation at an IF (intermediate frequency) of a microwave radio communications system using QAM (quadrature-phase amplitude modulation) and communicating symbols at a predetermined symbol rate, a SAW device tapped delay line as claimed in claim 13, wherein the first frequency is equal to the IF and the second frequency is an integral multiple of half the symbol rate.

* * * * *